United States Patent
Mitamura et al.

(10) Patent No.: US 7,226,507 B2
(45) Date of Patent: Jun. 5, 2007

(54) METHOD FOR PRODUCING SINGLE CRYSTAL AND SINGLE CRYSTAL

(75) Inventors: Nobuaki Mitamura, Fukushima (JP); Tomohiko Ohta, Gunma (JP); Izumi Fusegawa, Fukushima (JP); Masahiro Sakurada, Fukushima (JP); Atsushi Ozaki, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/561,865

(22) PCT Filed: May 27, 2004

(86) PCT No.: PCT/JP2004/007252

§ 371 (c)(1),
(2), (4) Date: Feb. 20, 2006

(87) PCT Pub. No.: WO2005/001169

PCT Pub. Date: Jan. 6, 2005

(65) Prior Publication Data

US 2006/0174819 A1    Aug. 10, 2006

(30) Foreign Application Priority Data

Jun. 27, 2003  (JP) ............................. 2003-184838

(51) Int. Cl.
*C30B 15/20* (2006.01)
(52) U.S. Cl. .............................. 117/13; 117/30; 117/32; 117/19; 117/20
(58) Field of Classification Search .................. 117/13, 117/19, 20, 30, 32
See application file for complete search history.

(56) References Cited

U.S. PATENT DOCUMENTS 6,153,009 A * 11/2000 Uesugi et al. ................. 117/20

(Continued)

FOREIGN PATENT DOCUMENTS

| JP | A 11-147786 | 6/1999 |
| JP | A 2000-178099 | 6/2000 |
| JP | A 2002-201093 | 7/2002 |

OTHER PUBLICATIONS

Voronkov, "The Mechanism of Swirl Defects Formation in Silicon," Journal of Crystal Growth, vol. 59, pp. 625-643 {1982}.
Dupret et al., "Global Modelling of Heat Transfer in Crystal Growth Furnaces," Int. J. Heat Mass Transfer, vol. 33, No. 9, pp. 1849-1871 {1990}.

*Primary Examiner*—Felisa Hiteshew
(74) *Attorney, Agent, or Firm*—Oliff & Berridge PLC

(57) ABSTRACT

The present invention is a method for producing a single crystal of which a whole plane in a radial direction is a defect-free region with pulling the single crystal from a raw material melt in a chamber by Czochralski method, wherein a pulling condition is changed in a direction of the crystal growth axis during pulling the single crystal so that a margin of a pulling rate is always a predetermined value or more that the single crystal of which the whole plane in a radial direction is a defect-free region can be pulled. Thereby, there can be provided a method for producing a single crystal in which when a single crystal is produced by CZ method, the single crystal of which a whole plane in a radial direction is a defect-free region entirely in a direction of the crystal growth axis can be produced with stability.

9 Claims, 9 Drawing Sheets

U.S. PATENT DOCUMENTS

| | | | |
|---|---|---|---|
| 6,190,452 B1 * | 2/2001 | Sakurada et al. | 117/20 |
| 6,592,662 B2 * | 7/2003 | Fusegawa et al. | 117/13 |
| 6,632,411 B2 * | 10/2003 | Hoshi et al. | 423/328.2 |
| 6,893,499 B2 * | 5/2005 | Fusegawa et al. | 117/13 |
| 6,913,646 B2 * | 7/2005 | Sakurada et al. | 117/13 |

* cited by examiner a length of the grown single crystal
in a direction of the crystal growth axis (cm)

METHOD FOR PRODUCING SINGLE CRYSTAL AND SINGLE CRYSTAL

TECHNICAL FIELD

The present invention relates to a method for producing a single crystal by Czochralski Method, more particularly, to a method for producing a single crystal over the entire radial direction of which is a defect-free region.

BACKGROUND TECHNOLOGY

A single crystal used as a substrate of semiconductor devices is, for example, a silicon-single crystal. It is mainly produced by Czochralski Method (referred to as CZ method for short hereafter). In recent years, semiconductor devices have come to be integrated higher and devices have come to be decreased in size. Along with the tendency, a problem of Grown-in defects introduced during growth of a single crystal has become more important.

Hereafter, Grown-in defects will be explained with reference to FIG. 8.

Generally, in the case of growing a silicon single crystal, when a growth rate of the crystal (a pulling rate of the crystal) is relatively high, there exist Grown-in defects such as FPD (Flow Pattern Defect) and COP (Crystal Originated Particle), which are considered due to voids consisting of agglomerated vacancy-type point defects, at a high density over the entire radial direction of the crystal. The region containing these defects due to voids is referred to as V (Vacancy) region.

Furthermore, when the growth rate of the crystal is lowered, along with lowering of the growth rate, an OSF (Oxidation Induced Stacking Fault) region is generated from the periphery of the crystal in a ring shape. When the growth rate is further lowered, the OSF ring shrinks to the center of the wafer and disappears. When the growth rate is further lowered, there exist defects such as LSEPD (Large Secco Etch Pit Defect) and LFPD (Large Flow Pattern Defect), which are considered due to dislocation loops consisting of agglomerated interstitial silicon atoms, at a low density. The region where these defects exist is referred to as I (Interstitial) region.

In recent years, a region containing no defects like FPD and COP due to voids as well as no defects like LSEPD and LFPD due to interstitial silicon atoms has been found between the V region and the I region and also outside the OSF ring. This region is referred to as N (Neutral) region. In addition, it has been found that when further classifying the N region, there exist Nv region (the region where a lot of vacancies exist) adjacent to the outside of the OSF ring and Ni region (the region where a lot of interstitial silicon atoms exist) adjacent to the I region, and that when performing thermal oxidation treatment, a lot of oxide precipitates are generated in the Nv region and little oxide precipitates are generated in the Ni region.

Furthermore, it has been found that, after performing the thermal oxidation treatment, there exist a region where defects detected by Cu deposition treatment are particularly generated (hereinafter referred to as Cu deposition defect region) in a portion of the Nv region where oxygen precipitation tends to be generated. And it has been found that the Cu deposition defect region cause degradation of electric property like oxide dielectric breakdown voltage characteristics.

It is considered that introduction amount of these Grown-in defects is determined by a parameter of V/G (mm$^2$/° C.·min) which is a ratio of a pulling rate V (mm/min) when a single crystal is grown and a temperature gradient G (° C./mm) of the crystal in the direction of pulling axis from melting point of silicon to 1400° C. at the vicinity of solid-liquid interface (for example, see V. V. Voronkov, Journal of Crystal Growth, 59 (1982), 625–643). Therefore, a single crystal is grown with controlling V/G to be constant at a determined value, thus a single crystal including desired defect region or desired defect-free region can be produced.

For example, in Japanese Patent Laid-open (Kokai) No. H11–147786, it is disclosed that, when a silicon single crystal is grown, the single crystal is pulled with controlling V/G in a determined range (for example, 0.112–0.142 mm$^2$/° C.·min) at the center of the crystal, thus a silicon single crystal wafer with no defects due to voids and no defects due to dislocation loops can be obtained. Furthermore, in recent years, the demand for a defect-free crystal of N region without Cu deposition defect region has become higher. And it has been demanded a production of a single crystal in which the single crystal is pulled with controlling V/G to be a determined defect-free region with high precision.

Generally, the temperature gradient G of a crystal in the direction of a pulling axis is considered to be determined only by HZ (hot zone: a furnace structure) of an apparatus for pulling a single crystal in which the single crystal is grown. It is known that the temperature gradient G of the crystal becomes lower as the single crystal grows, thus G becomes lower at the end of growing the straight body of the crystal than at the start of growing the straight body of the crystal. However, because it is extremely difficult to change HZ while pulling a single crystal, the temperature gradient G of the crystal isn't controlled. As described above, when a single crystal is grown with controlling V/G to be almost constant at a desired value, a pulling rate V is gradually lowered according to fluctuation (decline) of the temperature gradient G of the crystal as the single crystal grows.

However, even if a single crystal is grown with controlling V/G at a determined value by gradually lowering a pulling rate V as described above, when the defect region enlarging in the radial direction of the actually obtained single crystal is examined entirely in a direction of the crystal growth axis, distribution of the defect region-enlarging in the radial direction is different in former half of the straight body of the single crystal (the vicinity of the shoulder portion) and in latter half of the straight body of the single crystal (the vicinity of the tail portion). Thus there are some cases that a crystal quality (a defect region) determined at the start of growing the straight body of the single crystal can't be maintained entirely in a direction of growth axis.

For example, in order to produce a single crystal of which a whole plane in a radial direction is N region, a pulling rate V is determined at the start of growing the straight body of the single crystal so that V/G is a determined value, and the single crystal is grown with controlling V/G to be constant at a determined value by gradually lowering the pulling rate V according to the fluctuation of the temperature gradient G of the crystal during the growth of the single crystal. In this case, a whole plane in a radial direction of the former half of the straight body of the single crystal is N region. However, OSF region or V region is observed, or I region is observed in some portions of a plane in a radial direction of the latter half of the straight body of the single crystal. Thus, there are some cases that the whole plane in a radial direction of the crystal is not N region.

Especially, in the case of producing a single crystal with a large diameter like 200 mm or more so that the whole plane in a radial direction is N region, or in the case of producing a single crystal with controlling V/G with high precision in a narrower region like Nv region or Ni region in N region without Cu deposition defect region as shown in FIG. 8, it is considered extremely difficult to produce with stability a single crystal with a desired quality entirely in a direction of the crystal growth axis, which is one of the causes that lead to lower yield.

DISCLOSURE OF THE INVENTION

The present invention was accomplished in view of the aforementioned circumstances, and its object is to provide a method for producing a single crystal in which when a single crystal is produced by CZ method, a single crystal of which a whole plane in a radial direction of the crystal is a defect-free region entirely in a direction of the crystal growth axis can be produced with stability.

The present invention was accomplished to achieve the aforementioned object, and there is provided a method for producing a single crystal of which a whole plane in a radial direction is a defect-free region with pulling the single crystal from a raw material melt in a chamber by Czochralski method, wherein a pulling condition is changed in a direction of the crystal growth axis during pulling the single crystal so that a margin of a pulling rate that the single crystal of which the whole plane in a radial direction is a defect-free region can be pulled is always a predetermined value or more.

As described above, when a single crystal of which a whole plane in a radial direction is a defect-free region is grown by Czochralski method, a pulling condition is changed in the direction of the crystal growth axis during pulling the single crystal so that a margin of a pulling rate that the single crystal of which the whole plane in a radial direction is a defect-free region can be pulled is always a predetermined value or more, thus a single crystal of which a whole plane in a radial direction is a defect-free region entirely in a direction of the crystal growth axis can be produced with stability. Thereby, a yield for producing defect-free crystals can be improved.

In this case, it is preferable that the pulling condition is changed so that the margin of the pulling rate always satisfies a relational formula "the margin of the pulling rate$\geq 0.35\times\exp(-0.016\times$a diameter of a straight body of the single crystal [mm])+0.01".

When a single crystal is grown by CZ method, the pulling condition is changed so that the margin of the pulling rate always satisfies the above relational formula, thus a single crystal of which a whole plane in a radial direction is a defect-free region entirely in a direction of the crystal growth axis can be surely produced.

In these cases, it is preferable that the pulling condition of a single crystal to be changed is at least any one of a distance (L1) between a melt surface of the raw material melt and a heat insulating member provided in the chamber, a position of a heater heating the raw material melt, and a flow rate (F) of an inert-gas introduced into the chamber. And in this case, it is preferable that at least any one of the distance L1 between the surface of the raw material melt and the heat insulating member, the position of the heater, and the flow rate F of the inert-gas is changed so that a relation expressed with a function of a solidification ratio S of the single crystal is satisfied.

When a single crystal is grown, by changing at least any one of a distance between the surface of the raw material melt and a heat insulating member, the position of a heater heating the raw material melt, and the flow rate of the inert-gas introduced into the chamber, for example, so that a relation expressed with a function of a solidification ratio S of the single crystal is satisfied, a margin of a pulling rate can be always kept (controlled) easily at a predetermined value or more during pulling the single crystal.

Especially, it is preferable that the distance L1 between the surface of the raw material melt and the heat insulating member is changed so that the distance L1 between the surface of the raw material melt and the heat insulating member satisfies a relation of $L1=a\times S+b$ (a and b are constant) with the solidification ratio S of the single crystal. And, it is preferable that the position of the heater is changed so that a relative distance L2 between a heating center of the heater and the surface of the raw material melt satisfies a relation of $L2=c\times S+d$ (c and d are constant) with the solidification ratio S of the single crystal. And, it is preferable that the flow rate F of the inert-gas is changed so that the flow rate F of the inert-gas satisfies a relation of $F=e\times S+f$ (e and f are constant) with the solidification ratio S of the single crystal.

During a growth of a single crystal, when at least any one condition of the distance between the surface of the raw material melt and the heat insulating member, the position of the heater, and the flow rate of the inert-gas is changed, the condition is changed so that the above-mentioned relation expressed with a function of a solidification ratio S of the single crystal is satisfied respectively, thus a margin of a pulling rate can be always kept easily at a predetermined value or more during pulling the single crystal.

In addition, in the present invention, a silicon single crystal is pulled as the single crystal.

As described above, the method for producing a single crystal of the present invention is particularly preferable for applying to producing a silicon single crystal. Thereby, a silicon single crystal of which a whole plane in a radial direction is a defect-free region entirely in a direction of the crystal growth axis can be produced at a high rate with stability. Thereby, a yield of a silicon single crystal can be improved.

Furthermore, it is preferable that a single crystal with a diameter of 200 mm or more is pulled as the single crystal.

The method for producing a single crystal of the present invention is effectively applicable to producing a single crystal with a large diameter of 200 mm or more in which temperature variation tends to be generated in its plane. Thereby, a single crystal with a large diameter of which a whole plane in a radial direction is a defect-free region entirely in a direction of the crystal growth axis that has been conventionally difficult to be produced can be produced at a high rate with stability.

In these cases, it is preferable that at least a magnetic field of 3000 G or more is applied to the raw material melt when the single crystal is grown.

As described above, when a single crystal is grown, at least a magnetic field of 3000 G or more is applied to the raw material melt, thus a convection of the raw material melt is reduced. Thereby, a single crystal of defect-free can be grown at a higher rate with stability.

And, according to the present invention, a single crystal produced by the aforementioned method of producing a single crystal is provided.

As described above, the single crystal produced by the present invention can be a single crystal with very high quality of which a whole plane in a radial direction is a defect-free region entirely in a direction of the crystal growth axis.

As explained above, according to the present invention, when a single crystal is pulled, a margin of a pulling rate that the single crystal of which the whole plane in a radial direction is a defect-free region can be pulled can be always a predetermined value or more. Therefore, a single crystal of which a whole plane in a radial direction is a defect-free region entirely in a direction of the crystal growth axis can be produced with stability, thereby a yield for producing a defect-free crystal can be improved.

BEST MODE FOR CARRYING OUT THE INVENTION

Hereinafter, embodiments of the present invention will be described. However, the present invention is not limited thereto.

The inventors of the present invention performed thorough experiments and investigations in respect to a method for producing with stability a single crystal of which a whole plane in a radial direction is a defect-free region entirely in a direction of the crystal growth axis. Consequently, when a single crystal is grown by CZ method, as explained above, a temperature gradient G of the crystal in the direction of a pulling axis from melting point of silicon to 1400° C. at the vicinity of solid-liquid interface fluctuates as the single crystal grows. It has been newly found that a distribution ΔG in a plane in a radial direction of the temperature gradient G of the single crystal also fluctuates during pulling the single crystal. Furthermore, it has also been found that fluctuation of the distribution ΔG in a plane during pulling the single crystal causes a fluctuation of a margin of a pulling rate that a single crystal of which a whole plane in a radial direction is a defect-free region can be pulled during pulling the single crystal. Moreover, it has also been found that the larger the difference between a temperature gradient G of the crystal at a central portion and at a peripheral portion of the crystal becomes (namely, the larger ΔG becomes), the smaller a margin of a pulling rate becomes.

Figure 9:
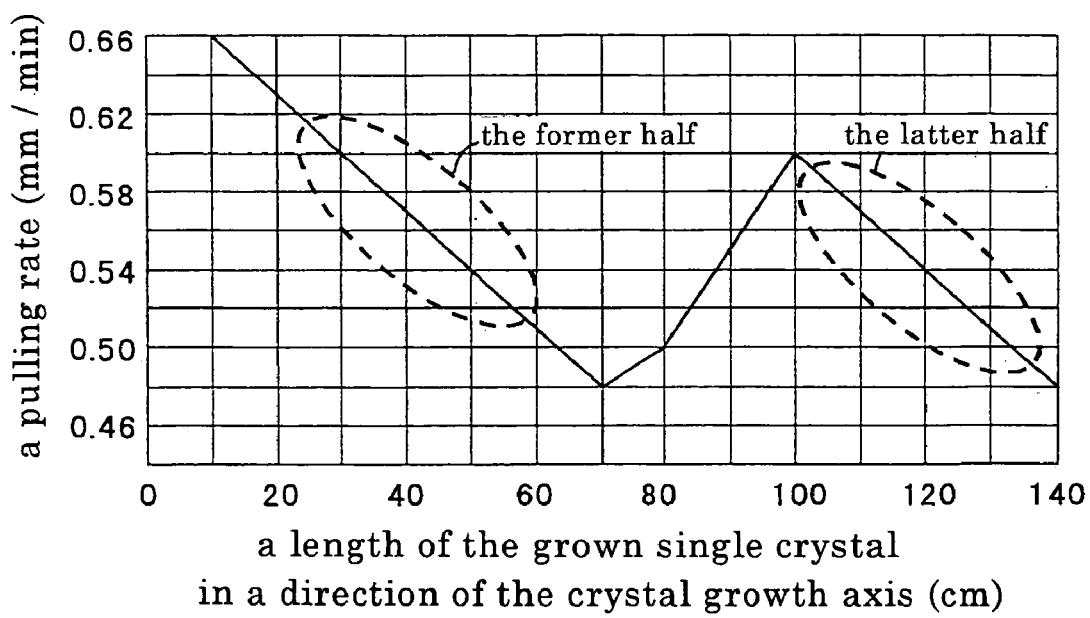
FIG. 9 is a graph showing a relationship between a length of the grown single crystal in a direction of the crystal growth axis and a pulling rate.

First, in order to examine a distribution ΔG in a plane and a margin of a pulling rate at a former half and at a latter half of a straight body of a single crystal grown by a conventional method, the inventors of the present invention grew a single crystal with lowering a pulling rate at the former half and at the latter half of the single crystal respectively as shown in FIG. 9 and changing V/G, and examined a defect region of the obtained single crystal. The result is shown in FIG. 2.

As a result of the above experiment, the following has been found. For example, in the case of producing a single crystal in a certain environment for producing a single crystal, even if a margin of a pulling rate that a single crystal of a defect-free region can be pulled is the range shown in FIG. 2(a) at the former half of the single crystal, by the distribution ΔG in a plane is fluctuated during growing the single crystal, the difference of the temperature gradient G of the crystal between at a central portion and at a peripheral portion of the crystal become larger (namely, ΔG becomes larger) when the latter half of the single crystal is grown, thus a margin of a pulling rate becomes smaller as shown in FIG. 2(a').

As described above, when the margin of a pulling rate becomes smaller because of the fluctuation of ΔG, for example, in the case of happening a little deviation etc. in a pulling rate V, it becomes difficult to control V/G in a defect-free region. Then, a desired crystal quality (a defect-free region) determined at the start of growing a straight body of the single crystal can't be maintained until the end of growing the straight body. As a result, it is considered that it leads to deterioration of yield for producing a single crystal.

Figure 2:
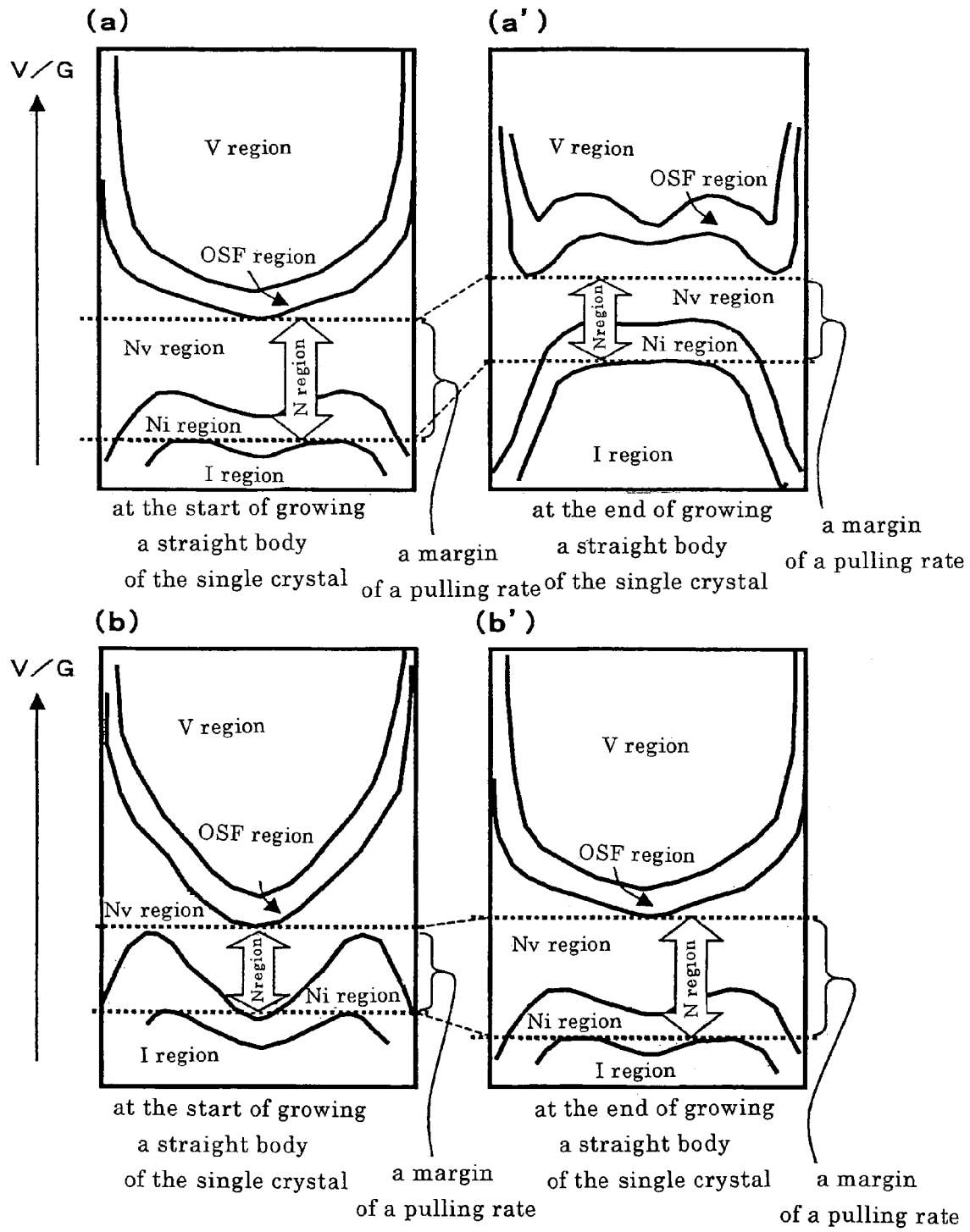
FIG. 2 shows a relationship between V/G and a distribution of crystal defects at the former half and at the latter half of a straight body of the single crystal in a conventional production of a single crystal.

On the contrary, it has been found that there is a case that even if when a margin of a pulling rate becomes small at growing the former half of a single crystal because ΔG is large, for example, as shown in FIG. 2(b), the margin is improved by the fluctuation of ΔG during the growth of the single crystal, and then the margin of a pulling rate becomes wider at growing a latter half of the single crystal as shown in FIG. 2(b'). However, in this case, it is not easy to control V/G in a defect-free region because the margin of a pulling rate is small at growing the former half of the single crystal. Accordingly, a defect-free region can't be obtained with stability, and high yield can't be achieved after all.

Then, the inventors of the present invention has found that ΔG is controlled by changing a pulling condition during the growth of a single crystal, a margin of a pulling rate that a single crystal of a defect-free region can be pulled can be always maintained over a certain value or more without lowering during the pulling of the crystal, thereby a single crystal occupied by a defect-free region entirely in a direction of the crystal growth axis can be produced with stability and a yield can be improved. The inventors further performed experiments and investigations, and has found that a distance between a surface of a raw material melt and a heat insulating member provided above the surface, a position of a heater, or a flow rate of an inert-gas introduced into the chamber is changed in the direction of the crystal growth axis during growing a single crystal, thereby ΔG is controlled and a margin of a pulling rate can always be maintained at a predetermined value or more. Thus, they accomplished the present invention.

Namely, the method for producing a single crystal according to the present invention is characterized in that when a single crystal of which a whole plane in a radial direction is a defect-free region is produced with pulling the single crystal from a raw material melt in a chamber by Czochralski method, a pulling condition is changed in the direction of the crystal growth axis during pulling the single crystal so that a margin of a pulling rate that a single crystal of which the whole plane in a radial direction is a defect-free region can be pulled is always a predetermined value or more.

Hereinafter, embodiments of the method for producing a single crystal according to the present invention will be explained in detail with reference to the drawings. However, the present invention is not limited thereto.

Figure 7:
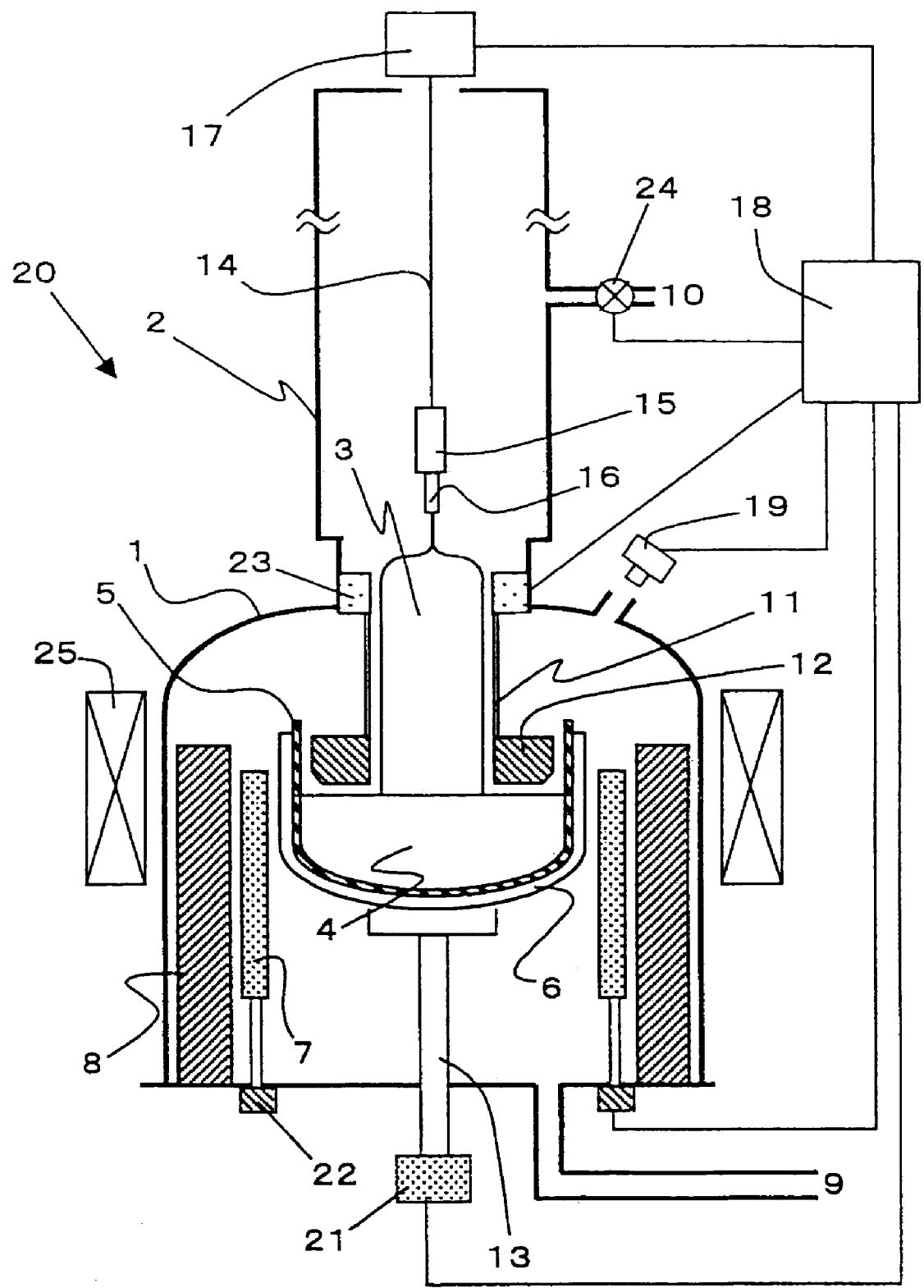
FIG. 7 is a schematic view of a constitution of an example of an apparatus for pulling a single crystal can be used for carrying out the method for producing a single crystal according to the present invention.

As explained hereafter, an apparatus for pulling a single crystal used in the method for producing a single crystal according to the present invention is not particularly limited as long as a distribution ΔG in a plane can be controlled by changing a pulling condition in the direction of the crystal growth axis during pulling the single crystal. For example, an apparatus 20 for pulling a single crystal as shown in FIG. 7 can be used. First, with reference to FIG. 7, an apparatus for pulling a single crystal that can be used for carrying out the method for producing a single crystal according to the present invention will be explained.

As for the apparatus 20 for pulling a single crystal as shown in FIG. 7, in a main chamber 1, a quartz crucible 5 for containing a raw material melt 4 therein and a graphite crucible 6 for protecting the quartz crucible 5 are supported by a supporting shaft 13 so that they can be rotated and moved upwardly or downwardly by a driving mechanism 21 for the crucible. And, a heater 7 and a heat shielding member 8 are provided so as to surround these crucibles 5 and 6. Furthermore, a driving means 22 for the heater is provided so that the position of the heater 7 can be controlled.

A pulling chamber 2 in which a grown single crystal 3 is stowed and from which the crystal is taken out is continuously provided from the top of the main chamber 1. At the top of the pulling chamber 2, a pulling mechanism 17 for pulling the single crystal 3 with rotating by a wire 14 is provided.

Furthermore, a gas flow-guide cylinder 11 is provided inside the main chamber 1. A heat insulating member 12 is provided at the bottom of the gas flow-guide cylinder 11, so as to oppose to the raw material melt 4 so that the heat radiation from the surface of the raw material melt 4 is intercepted and the temperature of the surface of the raw material melt 4 is kept. In addition, a driving means 23 for the heat insulating member is provided at the top of the gas flow-guide cylinder 11 so that position of the heat insulating member 12 can be controlled upwardly or downwardly by moving the gas flow-guide cylinder 11 upwardly or downwardly.

Further, an inert-gas like an argon gas can be introduced with controlling a flow rate by a valve 24 from a gas inlet 10 provided at the upper portion of the pulling chamber 2. The gas passed through between the single crystal 3 being pulled and the gas flow-guide cylinder 11, and passed through between the heat insulating member 12 and the melt surface of the raw material melt 4. And then the gas can be discharged from a gas outlet 9.

In addition, each of the driving mechanism 21 for the crucible, the driving means 22 for the heater, the driving means 23 for the heat insulating member and the valve 24 are connected with a control means 18 for pulling conditions. Data like position of the heater, position of the crucible, position of the heat insulating member, the gas flow rate, a position of the melt surface of the raw material melt 4 monitored by a CCD camera 19 and a pulled length of the single crystal obtained by the pulling mechanism 17 (namely, a solidification ratio S of the single crystal 3), are fed back to the control means 18 for pulling conditions, thus the distance between the melt surface of the raw material melt 4 and the heat insulating member 12, the position of the heater 7, and the flow rate of the inert-gas introduced into the pulling chamber 2 (the main chamber 1) can be changed according to the pulled length of the single crystal 3.

Furthermore, in the present invention, an apparatus 25 for generating a magnetic field can be provided outside the main chamber. Thereby, for example, a magnetic field of 3000 G or more can be applied to the raw material melt.

In the present invention, using such an apparatus 20 for pulling a single crystal, when a silicon single crystal 3 is pulled from a raw material melt 4 and grown by Czochralski method, for example, under an inert-gas atmosphere, at least any one of the distance between the surface of the raw material melt and the heat insulating member, the position of the heater, and the flow rate of the inert-gas introduced into the chamber is changed in the direction of the crystal growth axis during pulling the single crystal so that a margin of a pulling rate that a silicon single crystal of which the whole plane in a radial direction is a defect-free region can be pulled is always a predetermined value or more. Thereby, ΔG is controlled and a silicon single crystal is produced.

The present invention is explained concretely as follows. For example, First, a seed crystal 16 fixed at a seed holder 15 is immersed into the raw material melt 4 in the quartz crucible 5. Then, after the seed crystal 16 is pulled calmly with rotating and forming a neck portion, spreading to a desired diameter, growth of the silicon single crystal 3 having a subcolumnar straight body is started. At this time, V/G is controlled to be a predetermined value so that the single crystal of which the whole plane in a radial direction is a defect-free region can be pulled by controlling a pulling rate V of the straight body of the single crystal according to HZ etc. of an apparatus for pulling a single crystal. At the same time, a distribution ΔG in a plane in a radial direction of the single crystal of the temperature gradient G of the crystal is made to be small (ΔG is equalized in a plane in a radial direction of the crystal) by changing a pulling condition of the single crystal, and thereby a margin of a pulling rate is made to be a predetermined value or more. Then, during growing the straight body of the single crystal, V/G, namely a pulling rate V and/or the temperature gradient G of the crystal, is controlled so that a single crystal of a defect-free region can be grown. At the same time, a pulling condition is changed and controlled in the direction of the crystal growth axis so that a fluctuation of ΔG becomes small. Thereby, a margin of a pulling rate is kept always at a predetermined value or more.

At this time, the dimension of the margin of a pulling rate kept during growing the single crystal can be determined according to a diameter of the straight body of the single crystal to be grown. The inventors practically performed experiments over and over again to examine a relationship between a diameter of the straight body of the single crystal and a margin of a pulling rate. As a result, for example, when a single crystal of N region having a straight body with a diameter of 150 cm is produced, a margin of a pulling rate (a maximum pulling rate–a minimum pulling rate) can be kept at 0.040 or more by changing a pulling condition during growing the single crystal. In the case of a single crystal with a diameter of 200 cm, a margin of a pulling rate can be kept at 0.024 or more. In the case of a single crystal with a diameter of 300 cm, a margin of a pulling rate can be kept at 0.012 or more. In the case of a single crystal with a diameter of 400 cm, a margin of a pulling rate can be kept at 0.010 or more.

Namely, in the present invention, by changing a pulling condition of a single crystal during growing the single crystal, the margin of the pulling rate can satisfy the relational formula "the margin of the pulling rate$\geq 0.35\times\exp(-0.016\times$a diameter of a straight body of the single crystal [mm])$+0.01$" that satisfies the above mentioned relation in respect to the diameter of the straight body of the single crystal. Moreover, by changing more precisely the pulling condition of a single crystal, the margin of the pulling rate during growing the single crystal can be the utmost value.

In addition, in the method for producing a single crystal according to the present invention, a pulling condition to be changed during pulling the single crystal can be at least any one of a distance L1 between the melt surface of the raw material melt 4 and the heat insulating member 12, the position of the heater 7, and the flow rate F of an inert-gas introduced from the gas inlet 10. It is preferable that at least any one of these pulling conditions is changed so that a relation expressed with a function of a solidification ratio S of the single crystal 3 is satisfied.

Figure 10:
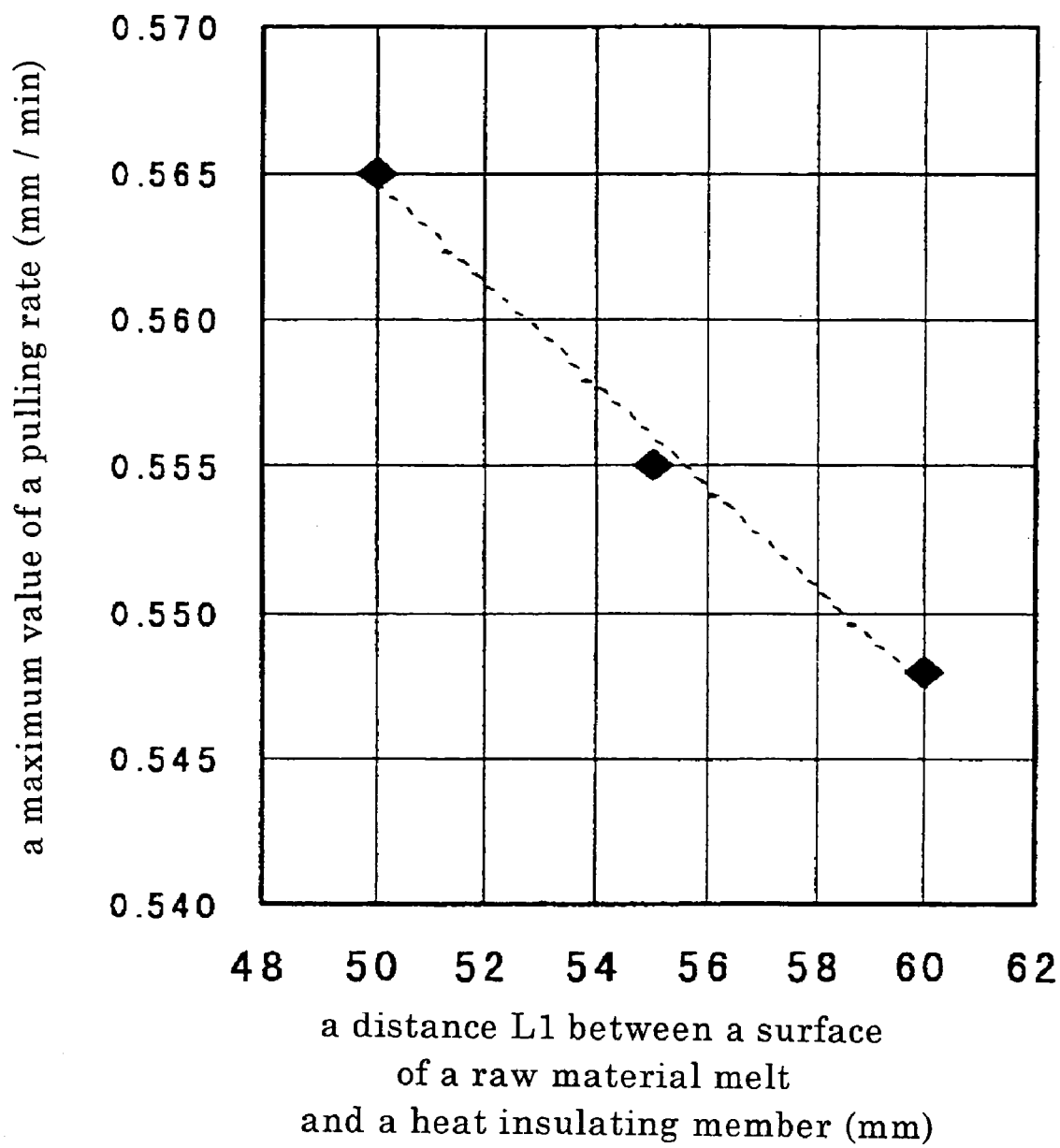
FIG. 10 is a graph showing a relationship between a distance L1 between a surface of a raw material melt and a heat insulating member and a maximum value of a pulling rate of the single crystal.
Figure 11:
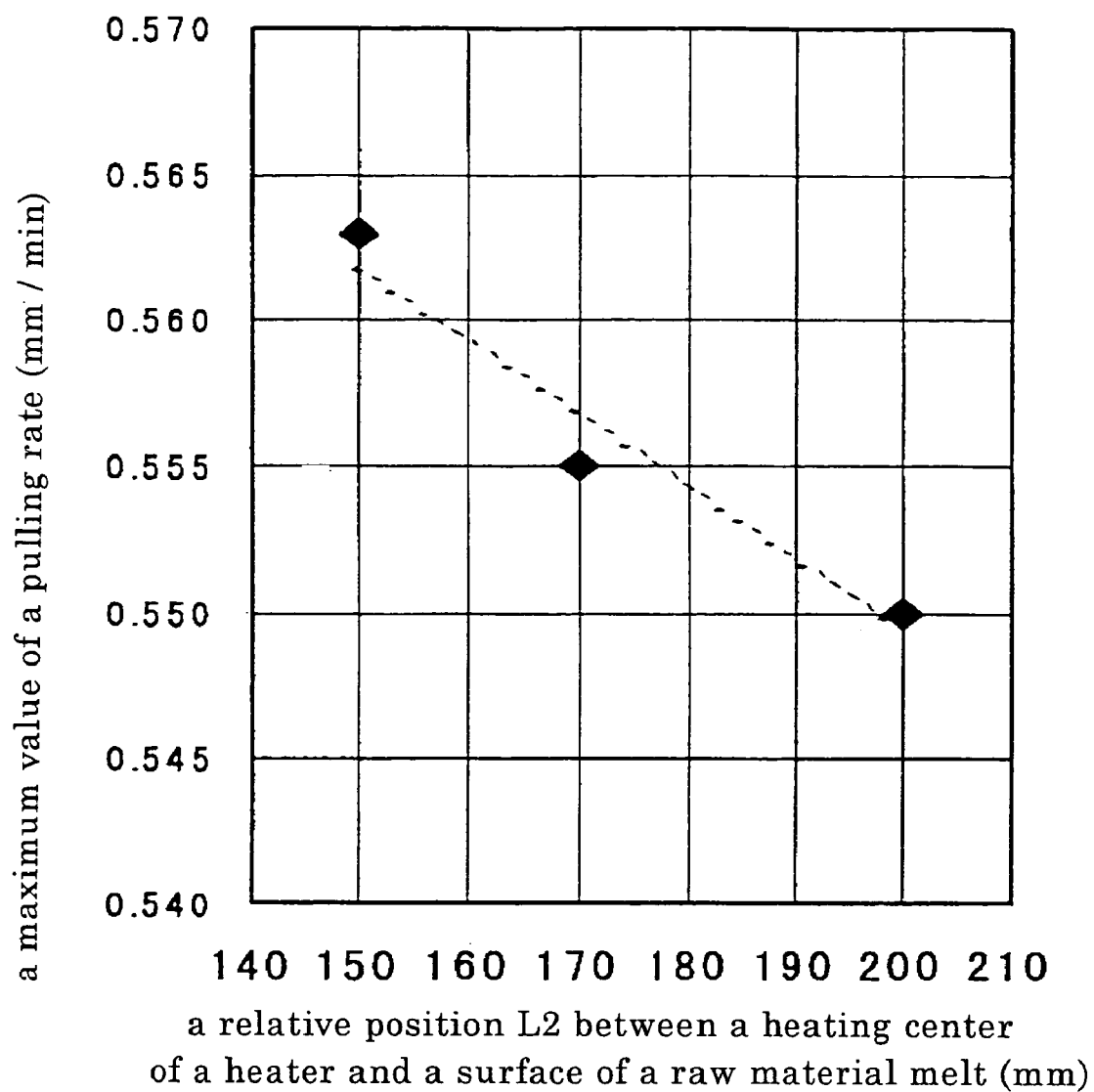
FIG. 11 is a graph showing a relationship between a relative position L2 between a heating center of a heater and a surface of a raw material melt and a maximum value of a pulling rate of the single crystal.

The inventors calculated the maximum value of a pulling rate of a single crystal at the portion of 50 cm of the straight body of the single crystal, when the single crystal with a diameter of 200 mm of which the whole plane in a radial direction is a defect-free region is grown in a certain production environment with various pulling conditions in which a distance L1 between the surface of a raw material melt and a heat insulating member, a position of the heater (namely, a relative position L2 between a heating center of the heater and the surface of the raw material melt), or a flow rate F of an inert-gas (argon gas) introduced through the gas inlet is changed. At this time, the maximum value of the pulling rate was calculated by the global heat transfer analysis software FEMAG (F. Dupret, P. Nicodeme, Y. Ryckmans, P. Wouters, and M. J. Crochet, Int. J. Heat Mass Transfer, 33, 1849 (1990)). Then the above-obtained relationship between the distance L1 between the surface of the raw material melt and the heat insulating member and the maximum value of the pulling rate is shown in FIG. 10. The above-obtained relationship between the relative position L2 between the heating center of the heater and the surface of the raw material melt and the maximum value of the pulling rate is shown in FIG. 11. The above-obtained relationship between the flow rate F of the inert-gas and the maximum value of the pulling rate is shown in FIG. 12.

As shown in FIG. 10, for example, by changing the distance L1 between the surface of the raw material melt and the heat insulating member, the maximum value of a pulling rate that a single crystal of a defect-free region can be pulled changes. The reason why such a relation exists is considered that a temperature gradient Ge of the crystal at a peripheral portion of the single crystal can be changed by changing the distance L1 between the surface of the raw material melt and the heat insulating member. For example, in the case of FIG. 10, by shortening the distance L1, the difference between a temperature gradient Ge at a peripheral portion of the single crystal and a temperature gradient Gc at a central portion of the single crystal becomes small, thus a distribution $\Delta G$ in a plane can become small ($\Delta G$ can be equalized in a plane in a radial direction of the crystal). Accordingly it is considered that the maximum value of the pulling rate becomes large.

Figure 12:
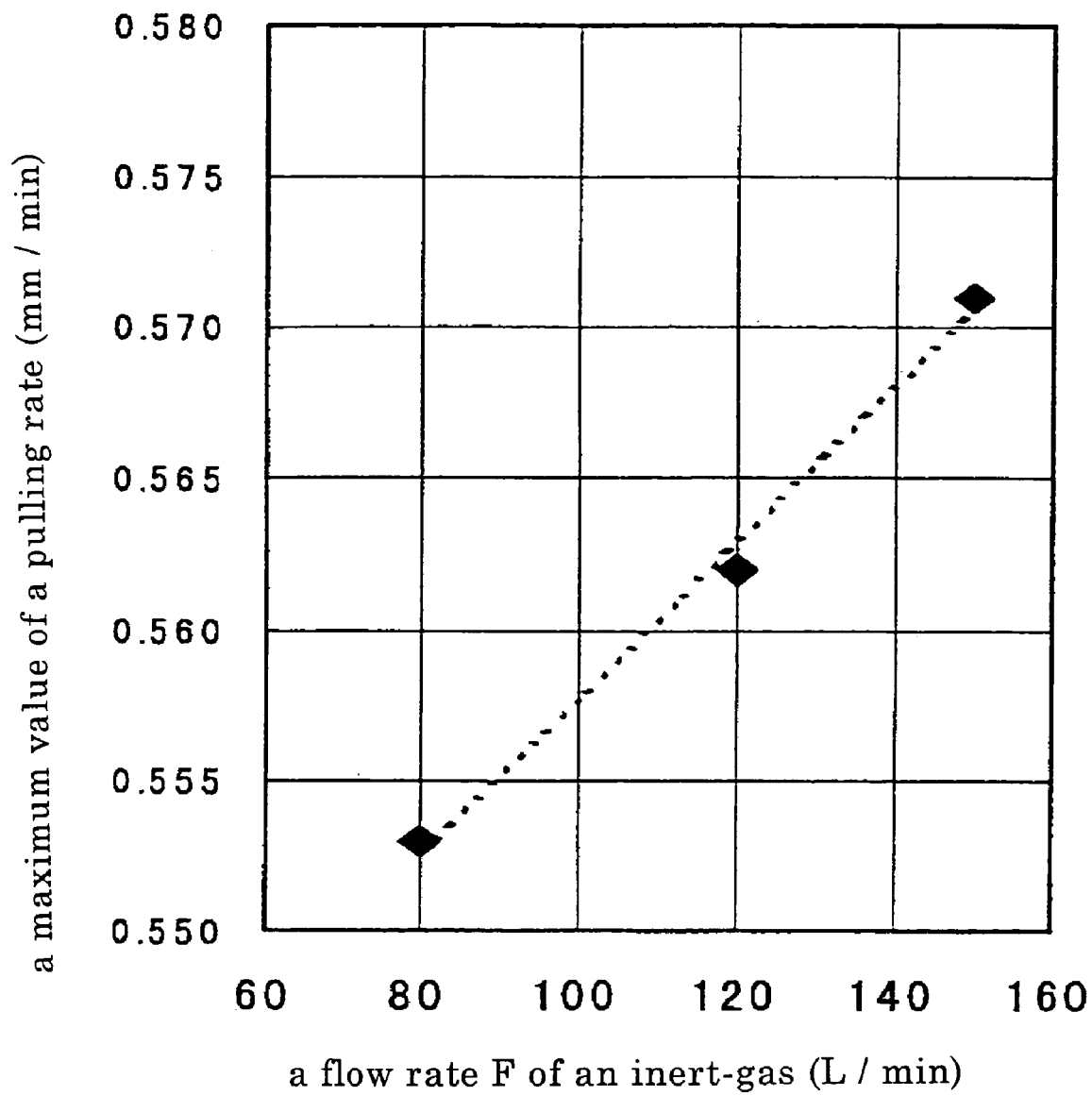
FIG. 12 is a graph showing a relationship between a flow rate F of an inert-gas and a maximum value of a pulling rate of the single crystal.

In addition, as shown in FIGS. 11 and 12, by changing the relative position L2 between the heating center of the heater and the surface of the raw material melt or the flow rate F of an inert-gas, the maximum value of a pulling rate that the single crystal of a defect-free region can be pulled can be also changed. Namely, as in the case with the distance L1, by changing the position of the heater or the flow rate F of an inert-gas, the temperature gradient Ge at a peripheral portion of the single crystal can be also changed. Thereby, the difference between the temperature gradient Ge at a peripheral portion of the single crystal and a temperature gradient Gc at a central portion of the single crystal becomes small, thus a distribution $\Delta G$ in a plane can become small.

Accordingly, during pulling a single crystal, at least any one of the distance L1 between the surface of the raw material melt and the heat insulating member, the position of the heater 7, and the flow rate F of an inert-gas is changed, for example, according to a pulled length of the single crystal, namely a solidification ratio S of the single crystal. Thereby, during pulling the single crystal, a distribution $\Delta G$ in a plane can be always equalized in a plane in a radial direction of the crystal and made to be small. Therefore, a maximum value of a pulling rate that a single crystal of a defect-free region can be pulled can become larger, and a minimum value of the pulling rate can become smaller. Thereby, a margin of the pulling rate can be always easily kept (controlled) with a width of a predetermined value or more.

Figure 3:
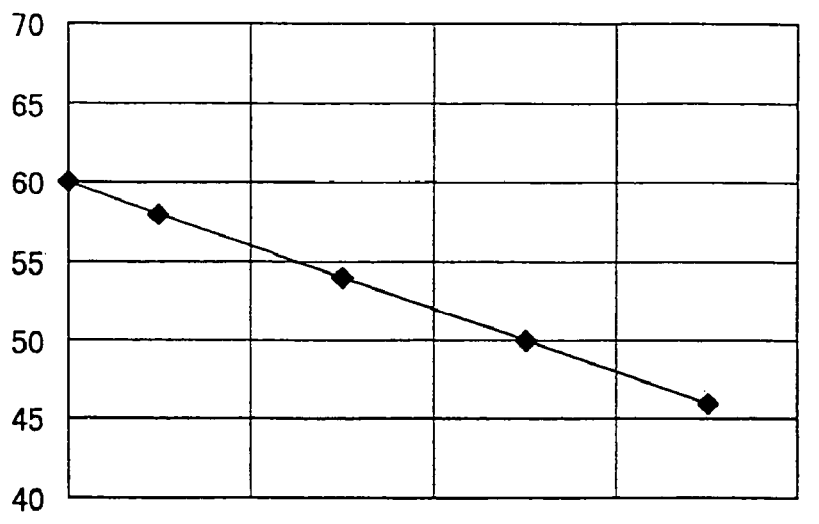
FIG. 3 is a graph showing a relationship between a solidification ratio S of the single crystal and a distance L1 between a surface of a raw material melt and a heat insulating member.

At this time, for example, in the case of changing the distance L1 between the surface of the raw material melt and the heat insulating member as a pulling condition, when the straight body of the single crystal is grown, the distance L1 between the surface of the raw material melt and the heat insulating member is changed so that the L1 satisfies a relation of an equation of the first degree with the solidification ratio S of the single crystal like $L1=a\times S+b$ (a and b are constant) as shown in FIG. 3 or a relation approximate to the equation. In this case, the distance L1 between the surface of the raw material melt and the heat insulating member can be changed with ease and high precision by controlling a height of the surface of the raw material melt using a driving mechanism 21 for the crucible, or by controlling the position of the heat insulating member 12 using a driving means 23 for the heat insulating member. Namely, during growing the crystal, the heat insulating member 12 may be gradually moved upwardly or downwardly by the driving means 23 for the heat insulating member, or the crucible is lifted by the driving mechanism 21 for the crucible with more than or not more than the decline of the melt level of the raw material melt caused by growth of the crystal with fixing the heat insulating member 12, thereby the distance L1 can be changed. And, the distance L1 between the surface of the raw material melt and the heat insulating member is changed as described above, thereby $\Delta G$ can be controlled to be small and a margin of a pulling rate can be always a predetermined value or more during pulling a single crystal. However, the driving means 23 for the heat insulating member is not always necessary to be provided. The distance L1 between the surface of the raw material melt and the heat insulating member can be also changed with high precision only by the driving mechanism 21 for the crucible.

Figure 4:
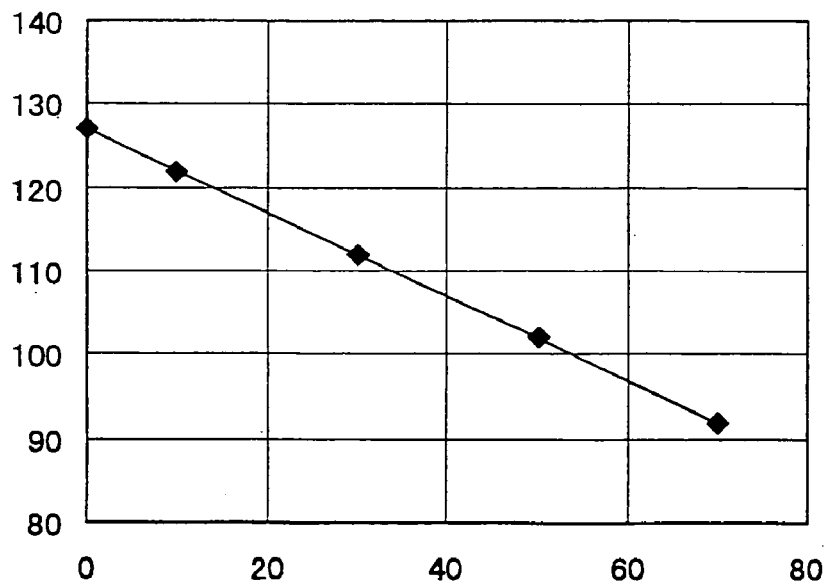
FIG. 4 is a graph showing a relationship between a solidification ratio S of the single crystal and a relative position L2 between a heating center of a heater and a surface of a raw material melt.

In addition, in the case of changing the position of the heater 7 as a pulling condition, when the straight body of the single crystal is grown, the position of the heater 7 is changed so that the relative position L2 between the heating center of the heater 7 and the surface of the raw material melt satisfies a relation of an equation of the first degree with the solidification ratio S of the single crystal like L2=c×S+d (c and d are constant) as shown in FIG. 4 or a relation approximate to the equation. Thereby, a margin of a pulling rate can be always a predetermined value or more during pulling the single crystal. In this case, the position of the heater 7 can be changed with ease and high precision by the driving means 22 for the heater.

Figure 5:
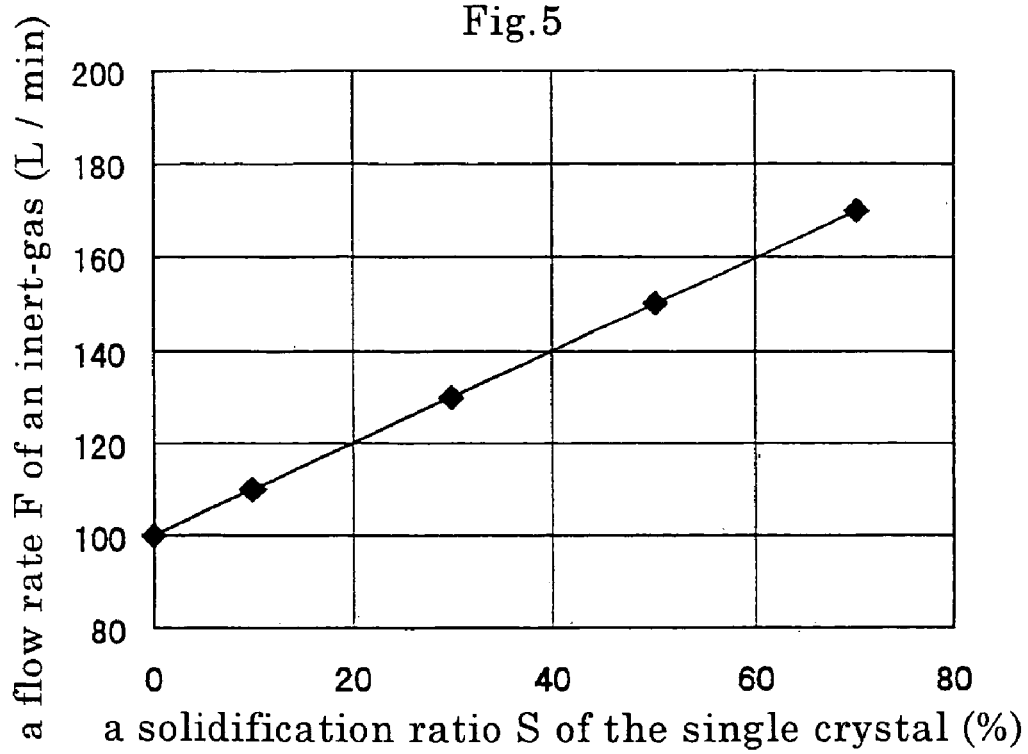
FIG. 5 is a graph showing a relationship between a solidification ratio S of the single crystal and a flow rate F of an inert-gas.

In the same way, in the case of controlling the flow rate F of an inert-gas, the flow rate F of an inert-gas introduced into the chamber is changed by the valve 24 so that the flow rate F of an inert-gas satisfies a relation of an equation of the first degree with the solidification ratio S of the single crystal like F=e×S+f (e and f are constant) as shown in FIG. 5 or a relation approximate to the equation. Thereby, a margin of a pulling rate can be always a predetermined value or more during pulling the single crystal. As for the inert-gas used in the production method according to the present invention, for example, argon gas, helium gas, etc. can be used.

In addition, each value of a–f in the equations of the first degree can be determined properly according to a production environment for producing a single crystal (for example, HZ of an apparatus for pulling a single crystal etc.). For example, a fluctuation of a margin of a pulling rate (a fluctuation of ΔG) during pulling the single crystal or a relationship between a margin of a pulling rate and each pulling condition (a relationship between ΔG and each pulling condition) are examined by performing simulation analysis, experimental measurement, etc. Thereby, the values of a–f can be determined properly.

Furthermore, thus obtained relationship between pulling conditions and the solidification ratio S of the single crystal is input to a control means 18 for pulling conditions beforehand, and during pulling the single crystal, data like the position of the melt surface of the raw material melt 4, a pulled length of the single crystal obtained by the pulling mechanism 17 and so on are fed back to the control means 18 for pulling conditions. Thereby, pulling conditions can be changed automatically with high precision according to the solidification ratio S of the single crystal during pulling the single crystal.

In addition, in the present invention, two or more of the distance L1 between the surface of the raw material melt and the heat insulating member, the position of the heater 7, and the flow rate F of an inert-gas can be changed at the same time during pulling the single crystal. If two or more of those conditions are changed according to the solidification ratio S of the single crystal, ΔG can be controlled to be much smaller, thus a margin of a pulling rate can always be the maximum value during pulling the single crystal.

Moreover, in the production method according to the present invention, if a magnetic field like 3000 G or more is applied to the raw material melt 4 by an apparatus 25 for generating a magnetic field provided outside the main chamber 1, a convection of the raw material melt is reduced and a defect-free region in the crystal can be enlarged, thus a single crystal of defect-free can be grown at a higher rate with more stability.

Figure 1:
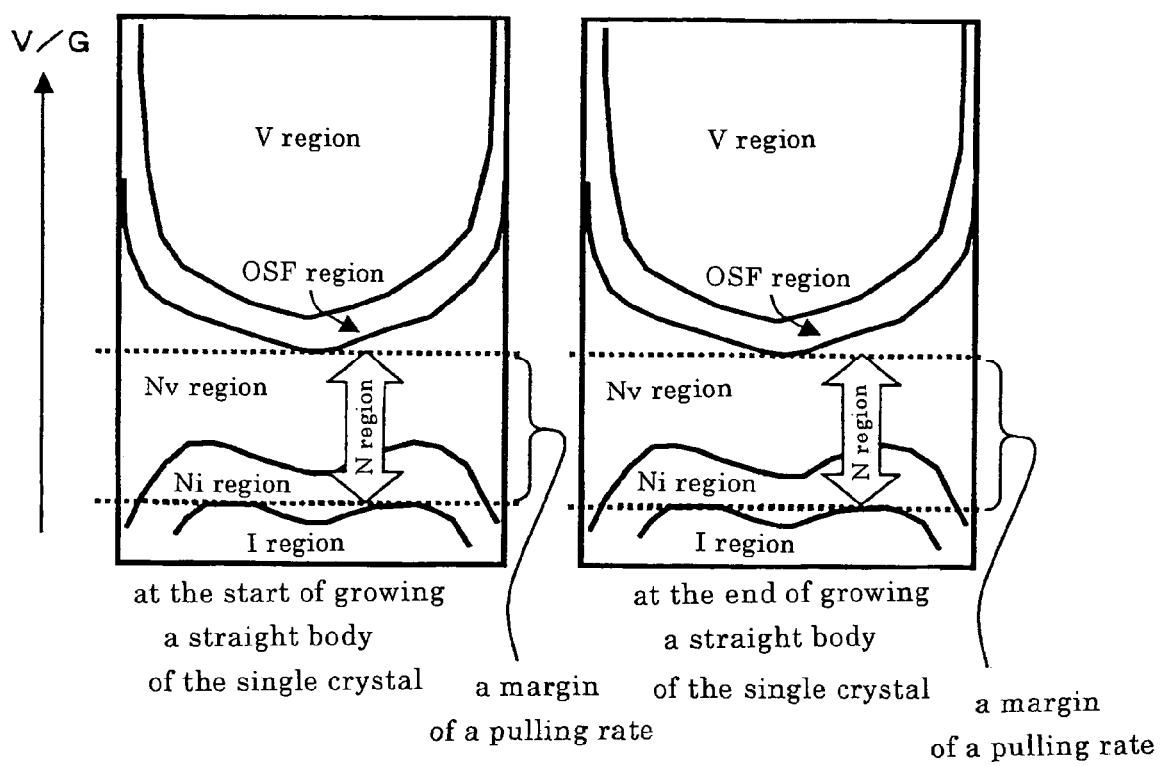
FIG. 1 shows a relationship between V/G and a distribution of crystal defects at the start and at the end of growing a straight body of the single crystal according to the method for producing a single crystal of the present invention.

As explained above, according to the method for producing a single crystal of the present invention, when a single crystal of which the whole plane in a radial direction is a defect-free region is grown by CZ method, a pulling condition is changed in the direction of the crystal growth axis during pulling the single crystal so that a fluctuation of a distribution ΔG in a plane becomes small. Thereby, for example, as a relationship between V/G and a distribution of crystal defects at the start and at the end of growing the straight body of the single crystal is shown in FIG. 1, a margin of a pulling rate that a single crystal of which the whole plane in a radial direction is a defect-free region can be pulled is able to be always a large value or farther a maximum value from the start to the end of growing the straight body of the single crystal. Namely, in the conventional way, a distribution of crystal defects is considerably different at the former half and at the latter half of the crystal as shown in FIG. 2. On the contrary, in the present invention, a distribution of crystal defects is almost the same at the former half and at the latter half of the crystal as shown in FIG. 1. Thus, ΔG can be made small and a margin of a pulling rate can be made large.

As described above, if the margin of a pulling rate is always a predetermined value or more during pulling the single crystal, a single crystal with very high quality in which a crystal quality that a whole plane in a radial direction is a defect-free region is maintained entirely in a direction of the crystal growth axis can be produced with stability. Thereby, a yield for producing a defect-free crystal can be improved.

Figure 8:
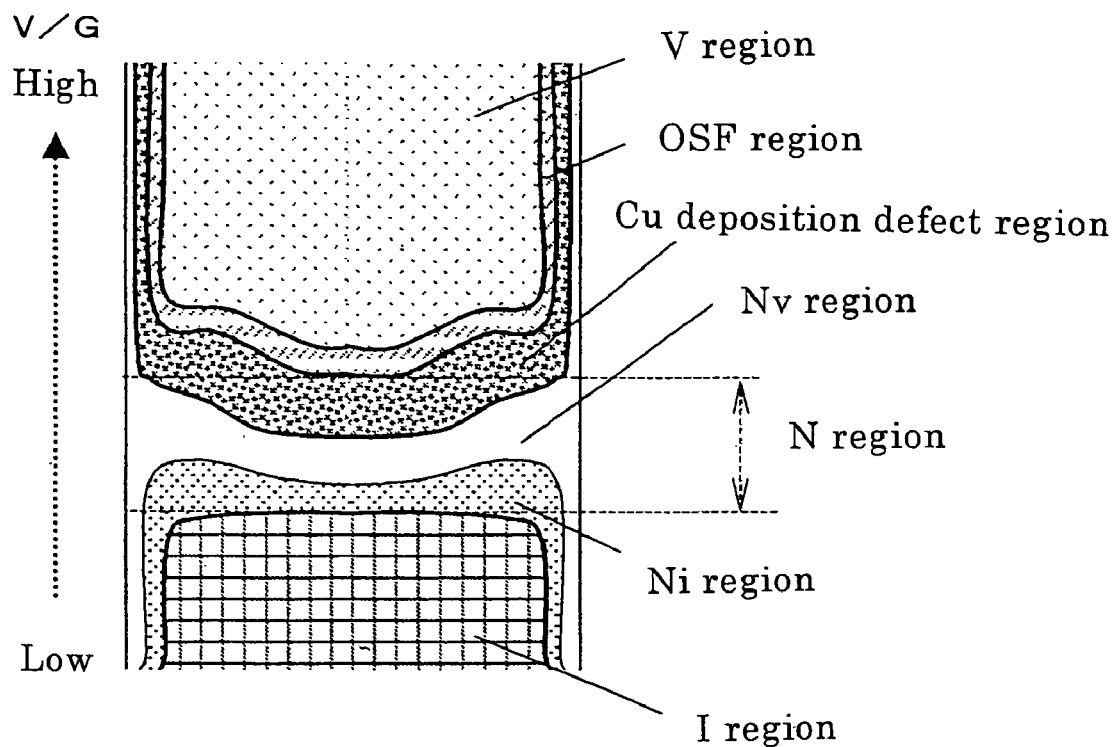
FIG. 8 is an explanatory view showing a relationship between V/G and a distribution of crystal defects.

Especially, a margin of a pulling rate can always be kept at a predetermined value or more during pulling a single crystal by the present invention, even in the case that a single crystal with a large diameter like 200 mm or more is produced so that the whole plane in a radial direction is a defect-free region, or in the case of producing a single crystal in a narrower region of Nv region or Ni region in N region not including Cu deposition defect region as shown in FIG. 8. Thereby, a single crystal can be produced at a higher rate with stability than usual, and a yield for producing a single crystal can be considerably improved.

Hereinafter, the present invention will be explained further in detail with reference to Examples and Comparative Examples, however, the present invention is not limited thereto.

EXAMPLE 1

Using an apparatus 20 for pulling a single crystal as shown in FIG. 7, 150 kg of polycrystalline silicon as a raw material was charged in a quartz crucible with a diameter of 24 inches (600 mm), and a silicon single crystal with orientation of <100>, a diameter of 200 mm was grown by CZ method under an argon gas atmosphere so that oxygen concentration is in the range of 22–23 ppma (ASTM'79 value). The length of the straight body of the single crystal was around 140 cm. In addition, during growing the single crystal, a pulling rate was controlled to be gradually lowered from 0.70 mm/min to grow the single crystal of N region in which Cu deposition defects are not detected. At the same time, the distance L1 between the surface of the raw material melt and the heat insulating member was changed as shown in the following table 1 by using the driving mechanism 21 for the crucible and the driving means 23 for the heat insulating member. The relationship between the solidification ratio S of the single crystal and the distance L1 at this time was shown in FIG. 3.

Figure 6:
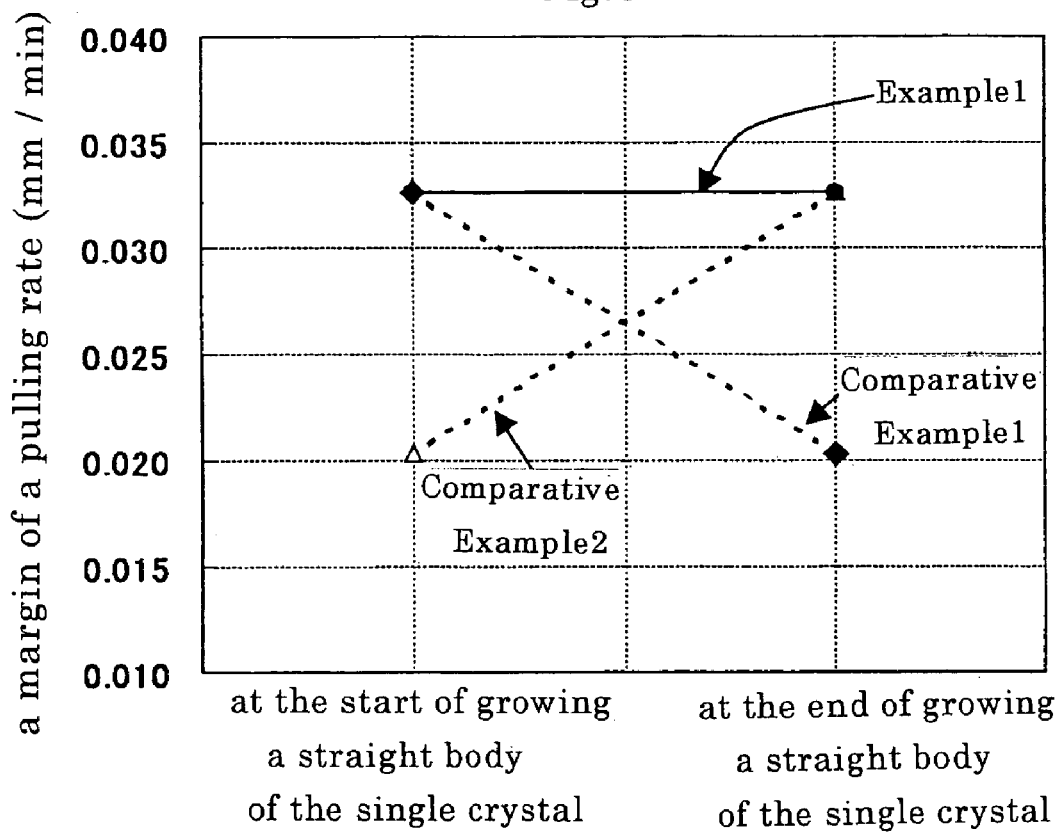
FIG. 6 is a graph showing results of calculating margins of a pulling rate at the start and at the end of the growing a straight body of the single crystal in Example 1 and Comparative Example 1 and 2.

Furthermore, a margin of a pulling rate at the start and at the end of growing a straight body of the single crystal of Example 1 were calculated by the global heat transfer analysis software FEMAG, and the results were shown in FIG. 6.

TABLE 1

| a length of the grown straight body(cm) | a solidification ratio S of the single crystal (%) | a distance L1 between the surface of the raw material melt and the heat insulating member (mm) |
|---|---|---|
| 0 | 0.0 | 60 |
| 20 | 10.0 | 58 |
| 60 | 30.1 | 54 |
| 100 | 50.1 | 50 |
| 140 | 70.2 | 46 |

Next, test wafers were cut from the above-grown single crystal at intervals of 10 cm in the direction of the crystal growth axis, and the wafers were subjected to surface grinding and polishing to produce test samples. Then, the test samples were tested in respect to crystal quality characteristics as shown below.

(1) A Test of FPD (V Region) and LSEPD (I Region)

The test samples were subjected to Secco etching for 30 minutes without stirring. Then, the plane of the wafer was observed with a microscope, and it was ascertained whether there were crystal defects.

(2) A Test of OSF

The test samples were subjected to a heat treatment at a temperature of 1100° C. for 100 minutes under a wet oxygen atmosphere. Then, the plane of the wafer was observed with a microscope, and it was ascertained whether there were OSFs.

(3) a Test of Defect by Cu Deposition Treatment

An oxide film was formed on each surface of the test samples. Then, the test samples were subjected to Cu deposition treatment, and it was ascertained whether oxide-film defects were existed. Evaluation conditions at that time were as follows:
 oxide film: 25 nm,
 intensity of electric field: 6 MV/cm,
 time of impressed voltage: 5 minutes.

EXAMPLE 2

Using the same apparatus 20 for pulling a single crystal as Example 1, a silicon single crystal with orientation of <100>, a diameter of 200 mm was grown by CZ method under an argon gas atmosphere so that oxygen concentration is in the range of 22–23 ppma (ASTM'79 value). The length of the straight body of the single crystal was around 140 cm. In addition, during growing the single crystal, a pulling rate was controlled to be gradually lowered as was the case with Example 1 to grow a single crystal of N region that Cu deposition defects are not detected. At the same time, the position of the heater was changed using the driving means 22 for the heater so that a relative position L2 between a heating center of the heater and the surface of the raw material melt satisfies values shown in the following table 2. The relationship between the solidification ratio S of the single crystal and the relative position L2 at this time was shown in the FIG. 4.

TABLE 2

| a length of the grown straight body(cm) | a solidification ratio S of the single crystal (%) | a relative position L2 between the heating center of the heater and the surface of the raw material melt (mm) |
|---|---|---|
| 0 | 0.0 | 127 |
| 20 | 10.0 | 122 |
| 60 | 30.1 | 112 |
| 100 | 50.1 | 102 |
| 140 | 70.2 | 92 |

Next, test wafers were cut from the above-grown single crystal at intervals of 10 cm in the direction of the crystal growth axis, and the wafers were subjected to surface grinding and polishing to produce test samples. Then, the test samples were tested in respect to crystal quality characteristics as was the case with Example 1.

EXAMPLE 3

Using the same apparatus 20 for pulling a single crystal as Example 1, a silicon single crystal with orientation of <100>, a diameter of 200 mm was grown by CZ method under an argon gas atmosphere so that oxygen concentration is in the range of 22–23 ppma (ASTM'79 value). The length of the straight body of the single crystal was around 140 cm. In addition, during growing the single crystal, a pulling rate was controlled to be gradually lowered as was the case with Example 1 to grow a single crystal of N region that Cu deposition defects are not detected. At the same time, the flow rate F of the argon gas introduced in the chamber was controlled with the valve 24 as shown in the following table 3. The relationship between the solidification ratio S of the single crystal and the flow rate F of the argon gas at this time was shown the FIG. 5.

TABLE 3

| a length of the grown straight body(cm) | a solidification ratio S of the single crystal (%) | a flow rate F of the argon gas (L/min) |
|---|---|---|
| 0 | 0.0 | 100 |
| 20 | 10.0 | 110 |
| 60 | 30.1 | 130 |
| 100 | 50.1 | 150 |
| 140 | 70.2 | 170 |

Next, test wafers were cut from the above-grown single crystal at intervals of 10 cm in the direction of the crystal growth axis, and the wafers were subjected to surface grinding and polishing to produce test samples. Then, the test samples were tested in respect to crystal quality characteristics as was the case with Example 1.

COMPARATIVE EXAMPLE 1

Using the same apparatus 20 for pulling a single crystal as Example 1, a silicon single crystal with orientation of <100>, a diameter of 200 mm was grown by CZ method under an argon gas atmosphere so that oxygen concentration is in the range of 22–23 ppma (ASTM'79 value). The length of the straight body of the single crystal was around 140 cm. In addition, during growing the single crystal, a pulling rate was controlled to be gradually lowered as was the case with Example 1 to grow a single crystal of N region that Cu deposition defects are not detected. Other pulling conditions were not changed during pulling the single crystal.

Furthermore, a margin of a pulling rate at the start and at the end of growing the straight body of the single crystal of Comparative Example 1 were calculated by the global heat transfer analysis software FEMAG, and the results were shown in FIG. 6.

Next, test wafers were cut from the above-grown single crystal at intervals of 10 cm in the direction of the crystal growth axis, and the wafers were subjected to surface grinding and polishing to produce test samples. Then, the test samples were tested in respect to crystal quality characteristics as was the case with Example 1.

COMPARATIVE EXAMPLE 2

Using the apparatus 20 for pulling a single crystal as shown in FIG. 7 in which HZ was changed to have a different structure from that of the Comparative Example 1 (the heat insulating member 12 was fortified and controlled to have a larger distance to the melt surface), a silicon single crystal with orientation of <100>, a diameter of 200 mm was grown by CZ method under an argon gas atmosphere so that oxygen concentration is in the range of 22–23 ppma (ASTM'79 value). The length of the straight body of the single crystal was around 140 cm. In addition, during growing the single crystal, a pulling rate was controlled to be gradually lowered from 0.70 mm/min to grow a single crystal of N region that Cu deposition defects are not detected. Other pulling conditions were not changed during pulling the single crystal as was the case with Comparative Example 1.

Furthermore, a margin of a pulling rate at the start and at the end of growing the straight body of the single crystal of Comparative Example 2 were calculated by the global heat transfer analysis software FEMAG, and the results were shown in FIG. 6.

Next, test wafers were cut from the above-grown single crystal at intervals of 10 cm in the direction of the crystal growth axis, and the wafers were subjected to surface grinding and polishing to produce test samples. Then, the test samples were tested in respect to crystal quality characteristics as was the case with Example 1.

As a result of performing tests of crystal quality characteristics in respect to the silicon single crystals produced in Examples 1–3 and Comparative Examples 1 and 2, in the silicon single crystal of the Examples 1–3, none of the defects of FPD, LSEPD and OSF were detected and no defects detected by Cu deposition treatment were observed entirely in a direction of the crystal growth axis of the straight body of the silicon single crystal.

The reason why the result was obtained is considered as follows. Because when the silicon single crystal was grown in Example 1 (as were the cases with Examples 2 and 3), a margin of a pulling rate that the single crystal of which the whole plane in a radial direction is a defect-free region can be pulled was always 0.024 mm/min (=0.35×exp(−0.016× 200 [mm])+0.01) or more from the start to the end of growing the straight body of the single crystal as shown in FIG. 6, thus the single crystal was grown with stability in N region that Cu deposition defect region is not detected.

On the contrary, in the silicon single crystal of the Comparative Example 1, LSEPD (I region) was observed in some portions of a plane in a radial direction at the latter half of the single crystal that the length of the straight body was 100 cm or more. In addition, the margin of the pulling rate of the Comparative Example 1 calculated by the global heat transfer analysis software FEMAG was reduced as the growth of the single crystal progressed, and the margin became a small value of less than 0.024 mm/min at the latter half of the straight body (the length of the straight body was approximately 100 cm or more) as shown in FIG. 6. Accordingly, in the Comparative Example 1, it is considered that LSEPD (I region) was observed in some portions in a radial direction because the single crystal of which the whole plane in a radial direction was N region couldn't be grown with stability at the latter half of the straight body.

In addition, in the silicon single crystal of the Comparative Example 2, Cu deposition defects (oxide-film defects) were observed in the range of 0–20 cm of the length of the straight body. It is considered that this happened because the margin of the pulling rate was small at the start of growing the single crystal (at the former half) as shown in FIG. 6.

In addition, the present invention is not limited to the embodiment described above. The above-described embodiment is mere an example, and those having substantially the same structure as technical ideas described in the appended claims and providing the similar functions and advantages are included in the scope of the present invention.

For example, above embodiment was explained in the case of producing a silicon single crystal. However, the present invention is not limited thereto, and the present invention is also applicable to produce a single crystal of compound semiconductor etc.

The invention claimed is:

1. A method for producing a single crystal of which a whole plane in a radial direction is a defect-free region with pulling the single crystal from a raw material melt in a chamber by Czochralski method, wherein at least any one of a distance (L1) between a melt surface of the raw material melt and a heat insulating member provided in the chamber, a position of a heater heating the raw material melt, and a flow rate (F) of an inert-gas introduced into the chamber is changed in a direction of the crystal growth axis during pulling the single crystal so that a margin of a pulling rate that the single crystal of which the whole plane in a radial direction is a defect-free region can be pulled always satisfies a relational formula "the margin of the pulling rate≧0.35×exp(0.016×a diameter of a straight body of the single crystal [mm])+0.01".

2. The method for producing a single crystal according to claim 1, wherein at least any one of the distance L1 between the surface of the raw material melt and the heat insulating member, the position of the heater, and the flow rate F of the inert-gas is changed so that a relation expressed with a function of a solidification ratio S of the single crystal is satisfied.

3. The method for producing a single crystal according to claim 2, wherein the distance L1 between the surface of the raw material melt and the heat insulating member is changed so that the distance L1 between the surface of the raw material melt and the heat insulating member satisfies a relation of L1=a×S+b (a and b are constant) with the solidification ratio S of the single crystal.

4. The method for producing a single crystal according to claim 2, wherein the position of the heater is changed so that a relative distance L2 between a heating center of the heater and the surface of the raw material melt satisfies a relation of L2 =c×S+d (c and d are constant) with the solidification ratio S of the single crystal.

5. The method for producing a single crystal according to claim 2, wherein the flow rate F of the inert-gas is changed so that the flow rate F of the inert-gas satisfies a relation of F=e×S+f (e and f are constant) with the solidification ratio S of the single crystal.

6. The method of producing a single crystal according to claim 1, wherein a silicon single crystal is pulled as the single crystal.

7. The method of producing a single crystal according to claim 1, wherein a single crystal with a diameter of 200 mm or more is pulled as the single crystal.

8. The method of producing a single crystal according to claim 1, wherein at least a magnetic field of 3000 G or more is applied to the raw material melt when the single crystal is grown.

9. A single crystal produced by the method of producing a single crystal according to claim 1.

* * * * *